REVERSE-BREAKDOWN DIODE PULSE GENERATOR

Filed Oct. 10, 1958 2 Sheets-Sheet 1

WILLIAM SHOCKLEY
INVENTOR.

BY Flehr & Swain
ATTORNEYS

WILLIAM SHOCKLEY
INVENTOR.
BY Flehr & Swain
ATTORNEYS

United States Patent Office 3,048,710

Patented Aug. 7, 1962

3,048,710

REVERSE-BREAKDOWN DIODE PULSE GENERATOR

William Shockley, 23466 Corta Via, Los Altos, Calif.

Filed Oct. 10, 1958, Ser. No. 766,470

5 Claims. (Cl. 307—88.5)

This invention relates generally to a pulse generator and more particularly to a pulse generator which employs bistable, two-terminal semiconductive devices.

It is a general object of the present invention to provide a pulse generator employing bistable, two-terminal semiconductive devices which serves to generate pulses at a predetermined frequency.

It is another object of the present invention to provide a pulse generator employing bistable, two-terminal semiconductive devices which is driven by pulses from an associated pulse circuit and which generates output pulses having a predetermined time delay with respect to the driving pulses.

It is a further object of the present invention to provide a pulse generator of the above character in which both the frequency of the generated pulses and the delay is adjustable.

These and other objects of the invention will become more clearly apparent from the following description when taken in conjunction with the accompanying drawing.

Referring to the drawing.

Figures 1, 2, 3, 4:
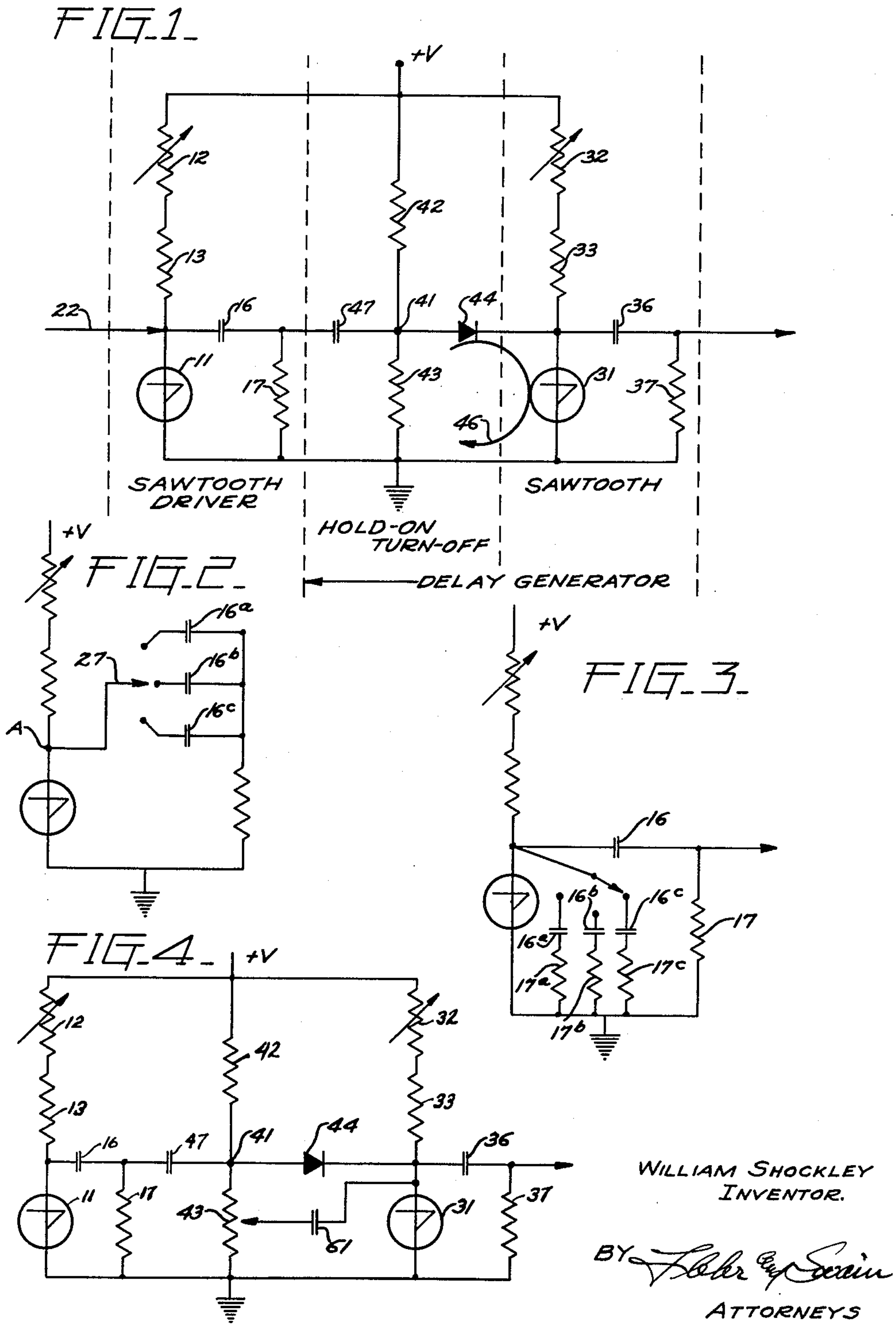
FIGURE 1 is a circuit diagram of a pulse generator in accordance with the present invention.
FIGURE 2 is a circuit diagram of another sawtooth generator suitable for use in the pulse generator of FIGURE 1.
FIGURE 3 is still another sawtooth generator which can be employed in the pulse generator of FIGURE 1.
FIGURE 4 shows another embodiment of the pulse generator.

Referring to FIGURE 1, the pulse generator includes a sawtooth driver generator for forming driving pulses which serve to drive the delay generator. The delay generator comprises a hold-on turn-off circuit and a sawtooth generator. The various portions of the circuits are delineated by the dotted lines.

The sawtooth driver generator and the sawtooth circuit of the delay generator are similar in operation and each include a bistable semiconductive device. Referring to the sawtooth driver generator, the bistable device 11 is a bistable, two-terminal device. It operates in two states: (1) an open or no conductance state which has a resistance of between 10 and 1000 megohms; and (2) a closed or high conductance state in which the resistance is between 1 and 10 ohms. The resistance in the second state depends upon the current drawn and decreases to relatively low values in some units. The device is switched from one state to the other by the control of the voltage and current. When the voltage exceeds the breakdown level, $V_B$, the device changes from the open to the closed state—provided sufficient current is available to hold it in the closed state. If the current drops below the threshhold or holding value, the device will switch back to the open condition. Devices of this type may be selected to have any desirable breakdown value $V_B$.

An adjustable resistor 12 and fixed resistor 13 are serially connected with the device 11 to a positive voltage source +V. The fixed resistor 13 determines the maximum current which may be drawn by the device 11 while the device 12 is adjustable to adjust the current supplied to the device. In practice, the resistor 12 may have many times the resistance of the resistor 13 whereby a large range of adjustment of current may be made.

A series combination of a timing capacitor 16 and a load resistor 17 is connected in shunt with the bistable device 11.

Figure 5:
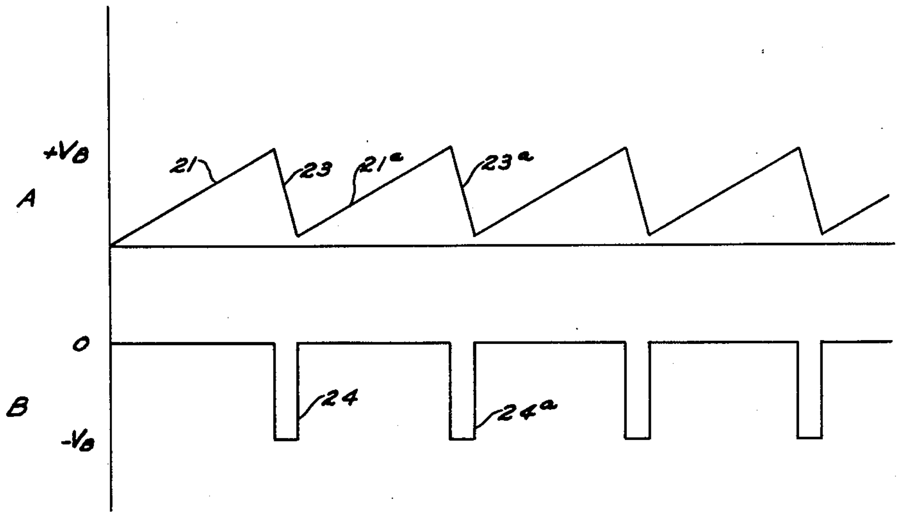
FIGURE 5 shows the waveforms at various parts of the sawtooth driver generators.

Operation of the circuit thus far described may be more clearly understood with reference to FIGURE 5. Assuming that the device 11 is in its low conductance state, the capacitor 16 is charged at a rate which is dependent upon the value of the capacitor and the value of the series resistors 12 and 13. This is indicated by the sloping line 21, FIGURE 5A. When the voltage at the terminal 22 reaches the breakdown value, $V_B$, the bistable device, it is rapidly switched into its high conductance state thereby discharging the capacitor 16 as indicated by the line 23. The rapid discharge of the capacitor causes a pulse of current to flow in the load resistor 17 and the voltage across the resistor will be pulse 24, FIGURE 5B. By selecting the value of resistors 12 and 13 such that the maximum current which may be drawn when the device 11 in its low resistance state is less than the holding current, and preferably in the neighborhood of one-third the holding current, the device cannot be sustained in its high conductance state and will rapidly transfer back to its low conductance state. The voltage will again rise along a curve indicated by **21*a*, then discharge as shown by 23*a* to form an output pulse 24*a*. The circuit thus far described generates a sawtooth voltage at the node 22 whose upper value is equal to the breakdown voltage, $V_B$, and whose lower value is equal to the voltage across the device 11** in its high conductance state, which may be in the order of a few tenths of a volt.

As previously described, the frequency of operation of the circuit is determined by the value of the resistors 12 and 13 and capacitor 16. If it is desired to construct a device in which the sawtooth frequency varies in decade fashion or any other fashion, a plurality of capacitors **16*a*, 16*b* and 16*c* may be connected as shown in FIGURE 2 with a switch 27 adapted to connect any one of the capacitors in circuit. However, in a circuit of the type shown in FIGURE 2, the device 11 may not reach its highest conductance state when the capacitors have a relatively small value. It is preferable to employ a circuit of the type shown in FIGURE 3 in which the series combination of capacitors 16*a*, 16*b* and 16*c* and resistors 17*a*, 17*b* and 17*c*, respectively, are connected in shunt with the capacitor 16 and load resistor 17. The resistors 17*a*, 17*b* and 17*c* are preferably of somewhat larger value than the load resistor 17. The pulse voltage across the load resistors will then be substantially independent of the size of the additional condenser. In the example of FIGURE 2, the decade variation may be obtained by adding capacitors with decade multiplies of capacitor 16**, while in the circuit of FIGURE 3 a decade variation is obtained if the added capacitors have a value which is nine-tenths of the decade multiples.

Thus, the sawtooth generator illustrated provides a means for generating output pulses 24 or a sawtooth voltage which has a predetermined adjustable frequency. The circuit is relatively simple in construction and reliable in operation.

The sawtooth circuit on the right-hand side is similar to the circuit just described, and the reference numerals corresponding to reference numerals 11—17 are 31—37.

The hold-on turn-off circuit provides means for maintaining the bistable device 31 in its high conductance state until a driving pulse is received at the terminal 41, at which time the device 31 is switched to its low conductance state and generates a sawtooth whose slope is dependent upon capacitor 36. The hold-on turn-off circuit includes a voltage divider comprising the resistors 42 and 43 connected between ground and the voltage supply +V, and a non-linear device 44 connected between the common terminal of the resistors 42 and 43 and the common terminal of the device 31 and capacitor 36. The voltage divider establishes a voltage which is a few volts above ground, for example, in the order of 4 or 5 volts. The impedance of this voltage is determined by the resistor 43. When the device 31 is turned on, there is a drop in the device which may be in the neighborhood of 1 volt or less. A similar drop is experienced across the non-linear device 44, which may be a conventional diode. This leaves a net of 2 volts in the loop defined by the arrow 46. This causes the flow of current through the device 31 which is equal to the voltage (2 volts) divided by the resistance of resistor 43 (100 ohms), or in the order of 20 milliamps for the example cited. This is sufficient current to hold the device 31 in its high conductance state.

To drive the circuit from the associated sawtooth driver generator or other driving circuit, a coupling capacitor 47 is connected between the terminal 41 and the associated circuit. The capacitor 47 is so chosen that an applied negative pulse will have sufficient amplitude to transmit a negative pulse to the device 31, which will cause the device to cease conduction. The current flowing through the resistors 32 and 33 then charges the capacitor 36 at a rate which is dependent upon the relative values of the resistor and capacitor. When the capacitor has charged to the breakdown voltage, the device 31 will breakdown generating an output pulse as previously described.

Figure 6:
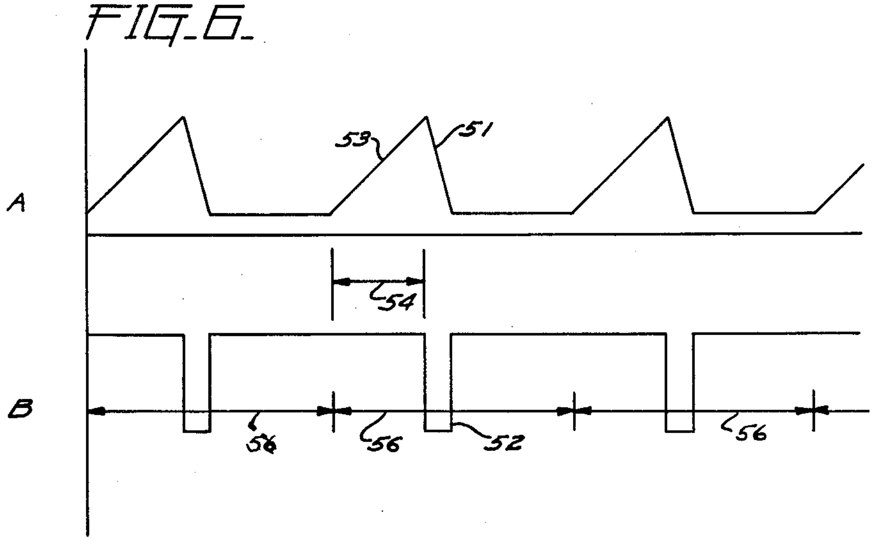
FIGURE 6 shows the waveforms generated in response to the driving pulses.

The circuit then awaits the arrival of another driving pulse before a new sawtooth is generated. Referring to FIGURE 6A, the sawtooth 51 represents a sawtooth which is formed upon application of the triggering pulse 24. It is seen that the triggering pulse turns the diode 31 off and that the capacitor 36 begins to charge towards the breakdown value. When the breakdown value is reached, the diode is switched to its high conductance state and an output pulse 52, FIGURE 6B, is formed. By controlling the slope of the leading edge 53 of the sawtooth, the time delay between the pulse 24 and the pulse 52 as represented by the arrow 54 may be controlled. Full control corresponds to the timing designated by the arrow 56. Thus, the output pulse 52 of the delay generator may be made to occur instantaneously after application of the pulse 24 or may be delayed for a period of time corresponding to the timing of the output sawtooth generator anywhere between the arrow 56.

Referring to FIGURE 4, a circuit similar to that of FIGURE 1 is illustrated. However, an additional capacitor 61 is added between the resistor 43 and the common terminal of capacitor 36 and device 31. Its capacity must be included in the load capacity of the basic sawtooth when calculating its time constant. The left side of the capacitor will lie at a potential of between zero volts and the potential of the point 41. In effect, it is a grounded capacitor insofar as charging is concerned and can be simply added to the capacitance of the capacitor 36 in determining the time constant.

If the four-layer diode is biased to a sufficiently high reverse voltage, it draws avalanche current and may, in fact, show a negative resistance. This effect may play a role in the turn-off circuit. If the diode is sufficiently reverse biased so that one of the junctions draws avalanche current, then this will tend to negate the beneficial effect of applying reverse voltage. This avalanche current can probably be drawn at a voltage much below the normal breakdown voltage. Consequently, when reverse voltage is applied, the voltage will occur more across the abrupt junction than across the others. Therefore, avalanche multiplication may occur at a voltage corresponding to the breakdown voltage of the weaker junction. This may possibly prove to be a disadvantage in the circuit if the storage effect on the conventional diodes are large. If this is the case, it may be desirable to use the capacitor 61 to reduce the amount by which the four-layer diode is kicked negative.

It is seen that a relatively simple pulse generating circuit is provided which is suitable for generating pulses having a predetermined frequency. Further, the unit may be used in connection with the novel hold-on turn-off circuit to provide a pulse delay generator which serves to form output pulses which are delayed a predetermined amount of time from the driving pulses applied thereto.

I claim:

1. A pulse generator comprising a bistable semiconductive device having two stable states: a low conductance and a high conductance state, said device being switched to the high conductance state in response to a predetermined voltage and to the low conductance state when the current is reduced below a predetermined value, resistance means connected in series with said device, said resistance means and said device defining a series current path, a voltage divider connected in parallel with the series network, a non-linear device connected between the voltage divider and said series current path, the connection of the non-linear device to said series current path being external of the bistable semiconductive device, a resistive capacitive network connected in shunt with said device, and means for applying a voltage across said voltage divider and series parallel combination, said serially connected resistance means being selected to supply a current to the device which is less than said predetermined value, said voltage divider providing a voltage to said non-linear device which maintains the current through the bistable device above said predetermined value.

2. A pulse generator as in claim 1 including a capacitor connected in shunt with the non-linear device.

3. A pulse generator as in claim 1 in which a generator serves to apply pulses to said voltage divider to trigger the bistable semiconductive device from a high conductance state to a low conductance state.

4. Apparatus as in claim 3 wherein said generator comprises a bistable semiconductive device having two stable states, one of which is a low conductance state and the other of which is a high conductance state, said device being switched to the high conductance state in response to a predetermined switching voltage and to the low conductance state when the current is reduced to a predetermined small value, resistance means connected in series with said device, a resistive capacitive network connected in shunt with said device, and means for applying a potential across said series parallel combination, said serially connected resistance means being so selected that the current supplied to the device through the resistor is less than said predetermined small value.

5. A pulse generator comprising a bistable semiconductive device having two stable states: a low conductance and a high conductance state, said device being switched to the high conductance state in response to a predetermined voltage and to the low conductance state when the current is reduced below a predetermined value, means serially connected to said bistable device for supplying a current which is less than the said predetermined value to said bistable device, said last named means and said device defining a series current path, a non-linear device connected to said series current path, the connection of the non-linear device to said series current path being external of the bistable semiconductive device, means for applying a voltage to said non-linear device which maintains the current through the bistable device above said predetermined value, and means for supplying a voltage pulse to said non-linear device to switch the bistable device from the high conductance to the low conductance state.

References Cited in the file of this patent

UNITED STATES PATENTS

| | | |
|---|---|---|
| 2,735,011 | Dickinson | Feb. 14, 1956 |
| 2,845,547 | Althouse | July 29, 1958 |
| 2,845,548 | Sillman et al. | July 29, 1958 |
| 2,924,724 | Booker | Feb. 9, 1960 |

OTHER REFERENCES

"Application of the Dynistor Diode to Off-On Controllers," by P. E. Pittman. Transistor and Solid State Circuit Conference, February 21, 1958, IRE-AIEE.